US008836088B2

(12) United States Patent
Lin et al.

(10) Patent No.: US 8,836,088 B2
(45) Date of Patent: Sep. 16, 2014

(54) SEMICONDUCTOR STRUCTURE HAVING ETCH STOP LAYER

(71) Applicant: Taiwan Semiconductor Manufacturing Company, Ltd., Hsinchu (TW)

(72) Inventors: Mei-Hsuan Lin, Tainan (TW); Chih-Hsun Lin, Tainan (TW); Chih-Kang Chao, Tainan (TW); Ling-Sung Wang, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/949,631

(22) Filed: Jul. 24, 2013

(65) Prior Publication Data

US 2013/0299987 A1 Nov. 14, 2013

Related U.S. Application Data

(62) Division of application No. 13/212,469, filed on Aug. 18, 2011, now Pat. No. 8,513,143.

(51) Int. Cl.
*H01L 23/58* (2006.01)
*H01L 23/48* (2006.01)
*H01L 21/768* (2006.01)

(52) U.S. Cl.
CPC ........ *H01L 23/481* (2013.01); *H01L 21/76822* (2013.01); *H01L 21/76834* (2013.01); *H01L 21/76802* (2013.01); *H01L 21/76832* (2013.01); *H01L 21/76826* (2013.01); *H01L 21/76825* (2013.01)

USPC ........... 257/637; 257/288; 257/368; 257/635; 257/638; 257/639; 257/640; 257/E21.487; 257/E21.488; 257/E21.489; 257/E21.49; 257/E21.491

(58) Field of Classification Search
USPC ......... 257/288, 368, 635, 637, 638, 639, 640, 257/E21.487, E21.488, E21.489, E21.49, 257/E21.491
See application file for complete search history.

(56) References Cited

U.S. PATENT DOCUMENTS

| | | | |
|---|---|---|---|
| 6,455,417 B1 * | 9/2002 | Bao et al. | 438/637 |
| 6,566,260 B2 * | 5/2003 | Gupta et al. | 438/687 |
| 7,741,699 B2 | 6/2010 | Ku et al. | |
| 2004/0164336 A1 | 8/2004 | Weimer et al. | |
| 2007/0040227 A1 | 2/2007 | Datta et al. | |
| 2007/0281410 A1 | 12/2007 | Lee et al. | |
| 2008/0085607 A1 | 4/2008 | Yu et al. | |
| 2009/0108415 A1 | 4/2009 | Lenski et al. | |
| 2009/0176350 A1 | 7/2009 | Belyansky et al. | |
| 2010/0081246 A1 | 4/2010 | Shin et al. | |
| 2010/0099268 A1 | 4/2010 | Timans | |
| 2010/0270627 A1 | 10/2010 | Chang et al. | |

* cited by examiner

*Primary Examiner* — Bac Au
(74) *Attorney, Agent, or Firm* — Lowe Hauptman & Ham, LLP

(57) ABSTRACT

A semiconductor structure includes a substrate, a conductive feature over the substrate, a conductive plug structure contacting a portion of an upper surface of the conductive feature, a first etch stop layer over another portion of the upper surface of the conductive feature, and a second etch stop layer over the first etch stop layer. The first etch stop layer is a doped etch stop layer. The first etch stop layer is to function as an etch stop layer during a predetermined etching process for etching the second etch stop layer.

20 Claims, 6 Drawing Sheets

US 8,836,088 B2

SEMICONDUCTOR STRUCTURE HAVING ETCH STOP LAYER

PRIORITY CLAIM

The present application is a divisional of U.S. application Ser. No. 13/212,469, filed Aug. 18, 2011, the disclosure of which in incorporated by reference herein in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as metal-oxide-semiconductor field-effect transistors (MOSFETs), are scaled down through various technology nodes, strained source/drain features (e.g., stressor regions) using epitaxial (epi) semiconductor materials and/or layers of compressive/tensile dielectric materials formed over the MOSFETs have been implemented to enhance carrier mobility and to improve device performance. Subsequently, in order to form a contact plug connecting an interconnection layer and the gate, drain, or source terminal of a MOSFET, different materials need to be at least partially removed in order to form an opening for forming the contact plug.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
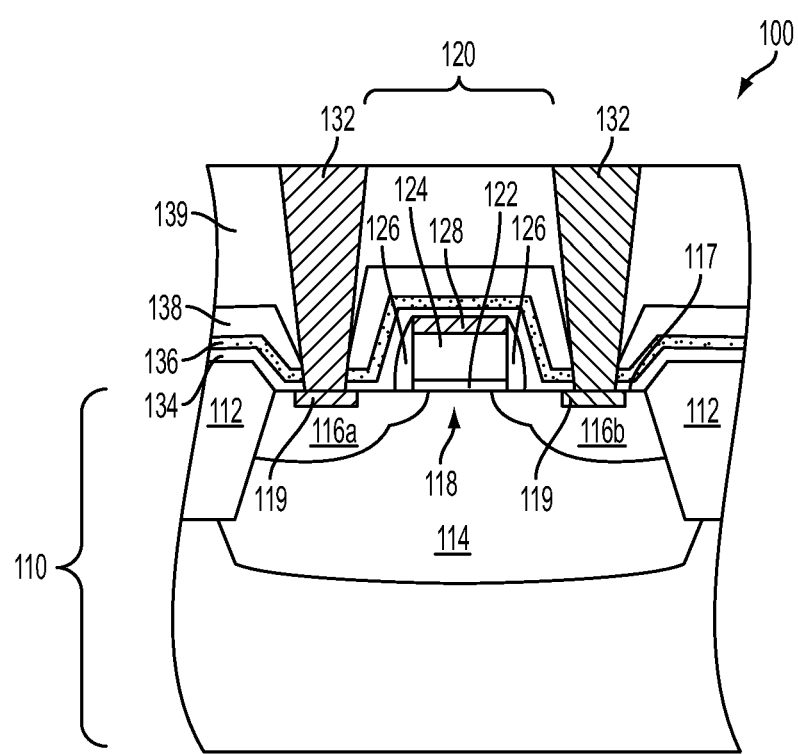
FIG. 1 is a cross-sectional view of a portion of a semiconductor structure in accordance with some embodiments.

It is understood that the following disclosure provides many different embodiments, or examples, for implementing different features of the disclosure. Specific examples of components and arrangements are described below to simplify the present disclosure. These are, of course, merely examples and are not intended to be limiting. In accordance with the standard practice in the industry, various features in the drawings are not drawn to scale and are used for illustration purposes only.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a cross-sectional view of a portion of a semiconductor structure 100 in accordance with some embodiments. Semiconductor structure 100 includes a substrate 110. In some embodiments, the substrate 110 includes: an elementary semiconductor such as silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, the substrate 110 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, the semiconductor substrate is a semiconductor on insulator. In some examples, the semiconductor substrate includes a doped epi layer or a buried layer. In other examples, the compound semiconductor substrate has a multilayer structure, or the substrate includes a multilayer compound semiconductor structure.

In the semiconductor structure 100, one or more insulation structures 112 are at least partially formed within the substrate 110 to define and electrically isolate regions for forming electrical components such as individual MOSFETs. For example, the region defined between the insulation structures 112 depicted in FIG. 1 is for forming a P-channel MOSFET (PMOS transistor) or an N-channel MOSFET (NMOS transistor). In some embodiments, the insulation structures 112 are local oxidation of silicon (LOCOS) structures or shallow trench isolation (STI) structures. In some embodiments, the insulation structures 112 comprise silicon oxide, silicon nitride, silicon oxynitride, fluoride-doped silicate glass (FSG), a low dielectric constant (low-K) dielectric material, other suitable materials, and/or combinations thereof.

Substrate 110 has a doped well 114 and two doped source/drain regions 116a/116b formed in the well 114. In at least one embodiment for forming a PMOS transistor, the well 114 comprises N-type dopant. In at least another embodiment for forming a NMOS transistor, the well 114 comprises P-type dopant. In some embodiments, the semiconductor structure 100 comprises at least one NMOS transistor and a PMOS transistor. The two doped source/drain regions 116a/116b are positioned to define a channel region 118 interposed between the doped source/drain regions 116a/116b. A portion of the doped source/drain regions 116a/116b is subject to a silicide process in order to form conductive features 119 on or over an upper surface 117 of the substrate 110. In some embodiments, the silicide process includes depositing a metal layer over the doped source/drain regions 116a/116b, annealing the metal layer such that the metal layer is able to react with materials in the doped source/drain regions 116a/116b to form metal silicide, and then removing the non-reacted metal layer. In some embodiments, a heavily doped region is formed in the source/drain regions 116a/116b as the conductive features 119, and the silicide process is omitted.

Substrate 110 also has a gate stack 120 formed over the channel region 118. The gate stack 120 includes a gate dielectric 122, a gate electrode 124, and spacers 126, and a top portion of the gate electrode 124 is subjected to a silicide process to form a conductive feature 128 on top of the gate stack 120. In some embodiments, the upper portion of the gate electrode 124 is not subjected to the silicide process, and the gate electrode 124 functions as the conductive feature 128. In some embodiments, the gate electrode 124 includes one or more layers of metallic materials comprising aluminum, copper, aluminum-copper, tungsten, P-type workfunction metal, N-type workfunction metal, or barrier materials. Therefore, in some embodiments, the gate electrode 124 comprises one or more layers of aluminum, copper, tungsten, titanium, tantulum, tantalum aluminum, tantalum aluminum nitride, titanium nitride, tantalum nitride, nickel silicide, cobalt silicide, silver, TaC, TaSiN, TaCN, TiAl, TiAlN, WN, and/or combinations thereof. In some embodiments, the gate electrode includes polysilicon.

One or more conductive plug structures 132 are formed over the conductive features 119 and contacting at least a portion of upper surfaces of the conductive features 119. In some embodiments, the conductive plug structures comprise a metallic material that is compatible with silicon (Si) or silicon germanium (SiGe) materials, such as tungsten (W), titanium (Ti), titanium nitride (TiN), or tantalum (Ta). In some embodiments, the conductive plug structures 132 comprise a conductive metallic material including aluminum (Al), aluminum-copper alloy, or copper (Cu).

A buffer layer 134 is formed over the substrate 110 and the conductive features 119/128. In at least one embodiment, the buffer layer 134 comprises silicon oxide. In some embodiments, the buffer layer 134 comprises silicon nitride, silicon oxy-nitride, silicon carbide, or combinations thereof. A first etch stop layer 136 is formed over the buffer layer 134. In some embodiments, the first etch stop layer 136 is formed in buffer layer 134, e.g., in an upper portion of the buffer layer. The buffer layer 134 and the first etch stop layer 136 are formed over another portion of the upper surface of the conductive features 119/128 that is not occupied by the conductive plug structures 132. In at least one embodiment, the first etch stop layer 136 is a doped etch stop layer comprising carbon-doped silicon oxide. In some embodiments, the first etch stop layer 136 silicon comprises oxide doped with carbon, nitride, hydrogen, indium, germanium, or a combination thereof. In some embodiments, the doped first etch stop layer is formed by implantation of appropriate atoms of the doping material in the buffer layer 134.

The semiconductor structure 100 further has a second etch stop layer 138 formed over the first etch stop layer 136. In some embodiments, the second etch stop layer 138 comprises silicon nitride or silicon oxynitride. In at least one embodiment, the second etch stop layer 138 comprises tensile silicon nitride, compressive silicon nitride, or stacked layers of tensile silicon nitride and compressive silicon nitride. In at least one embodiment for forming a PMOS transistor, a portion of the second etch stop layer 138 over the gate stack 120 and the source/drain regions 116a/116b comprises compressive silicon nitride. In yet another embodiment for forming an NMOS transistor, a portion of the second etch stop layer 138 over the gate stack 120 and the source/drain regions 116a/116b comprises tensile silicon nitride.

The semiconductor structure 100 further includes a dielectric layer 139 formed over the second etch stop layer 138 and surrounding the conductive plug structures 132. In some embodiments, the dielectric layer 139 comprises phosphorous doped silicate glass (PSG), undoped silicate glass (USG), Phosphorus-doped Tetraethoxy Silane (PTEOS), Boron-Phosphosilicate Tetraethoxy Silane (BPTEOS), spin-on-glass (SOG), other suitable materials, or combinations thereof. In some embodiments, one or more layers of conductive layers and interlayer dielectric layers are formed over the structure depicted in FIG. 1 to connect the gate stack 120 and/or the drain/source regions 116a/116b to other electrical components and/or devices on the same or a different semiconductor chip.

Figure 2A:
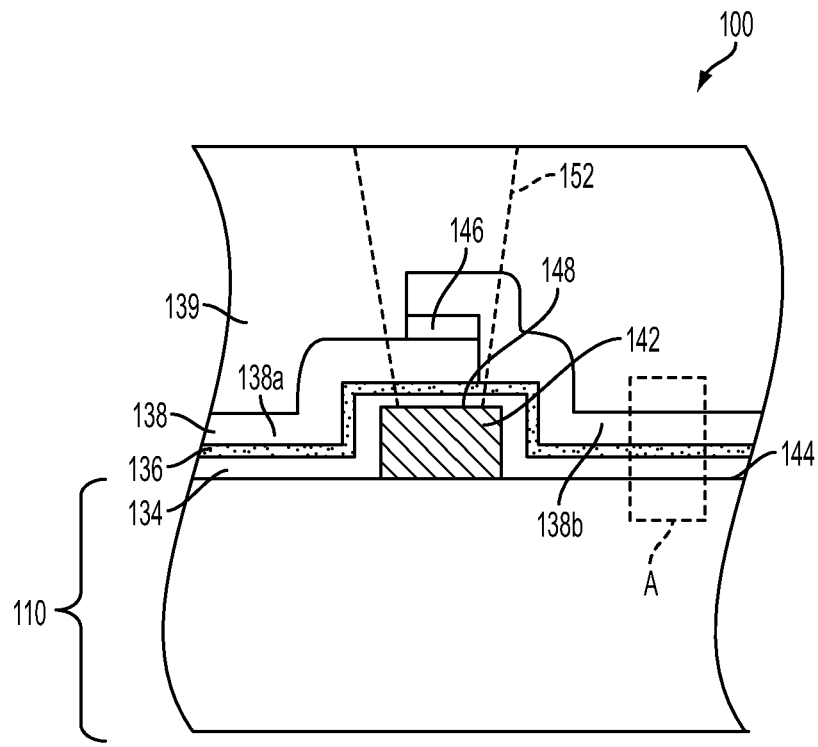
FIG. 2A is a cross-sectional view of another portion of the semiconductor structure of FIG. 1 in accordance with some embodiments.

FIG. 2A is a cross-sectional view of another portion of the semiconductor structure 100 in accordance with some embodiments. The semiconductor structure 100 includes a substrate 110 and a conductive feature 142 formed on or over an upper surface 144 of the substrate 110. In some embodiments, the conductive feature 142 is the same or similar to the conductive structures 119/128 depicted in FIG. 1. A buffer layer 134 is formed over the substrate 110 and the conductive feature 142, a first etch stop layer 136 is formed over the buffer layer 134, and a second etch stop layer 138 is formed over the first etch stop layer 136. The second etch stop layer 138 includes a first portion 138a of a first material and a second portion 138b of a second material. The first portion 138a and the second portion 138b are formed one after another and overlap one another over the conductive feature 142. In some embodiments, the first portion 138a of the second etch stop layer 138 comprises tensile silicon nitride, and the second portion 138b of the second etch stop layer 138 comprises compressive silicon nitride.

An adhesive layer 146 is formed between the first portion 138a and the second portion 138b at the overlapped portion. In some embodiments, the adhesive layer 146 bonds the first portion 138a with a hard mask layer (not shown) for patterning the first portion 138a before the formation of the second portion 138b. In some embodiments, the adhesive layer 146 comprises silicon oxide, silicon nitride, silicon oxy-nitride, silicon carbide, or combinations thereof. Additionally, a dielectric layer 139 is formed over the second etch stop layer 138.

An opening 152 is formed in order to form a conductive plug structure (similar to plug structure 132 of FIG. 1) in contact with an upper surface 148 of the conductive feature 142. In some embodiments, the opening 152 is formed by etching through the dielectric layer 139, the second etch stop layer 138, the adhesive layer 146, the first etch stop layer 136, and the buffer layer 134. In practice at times, a mask for forming the opening 152 may be misaligned, and the etch process for removing the adhesive layer 146 may inadvertently etch away a portion of other materials in the semiconductor structure 100 due to the misalignment of the mask. Therefore, in certain circumstances, the to-be-formed conductive plug structure does not properly contact the conductive structure 142 or unexpectedly causes a short circuit among the conductive structure 142 and other devices or components. By implementing the first etch stop layer 136 as being capable of withstanding the etch process for removing the adhesive layer 146, a level of tolerance with regard to manufacturing variations is broadened.

Figure 2B:
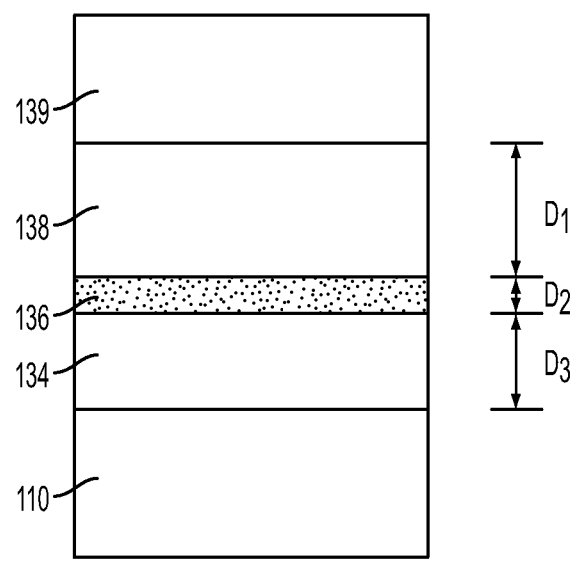
FIG. 2B is an enlarged view of region A of FIG. 2A in accordance with some embodiments.

FIG. 2B is an enlarged view of region A of FIG. 2A in accordance with some embodiments. In some embodiments, the thickness $D_1$ of the second etch stop layer 138 ranges from 200 to 800 angstroms (Å), the thickness $D_2$ of the first etch stop layer 136 ranges from 5 to 40 Å, and the thickness $D_3$ of the buffer layer 134 ranges from 10 to 90 Å. In some embodiments, the thickness $D_2$ of the first etch stop layer 136 is ⅓ to ¾ of the summation of the thickness $D_2$ of the first etch stop layer 136 and the thickness $D_3$ of the buffer layer 134.

Figure 3:
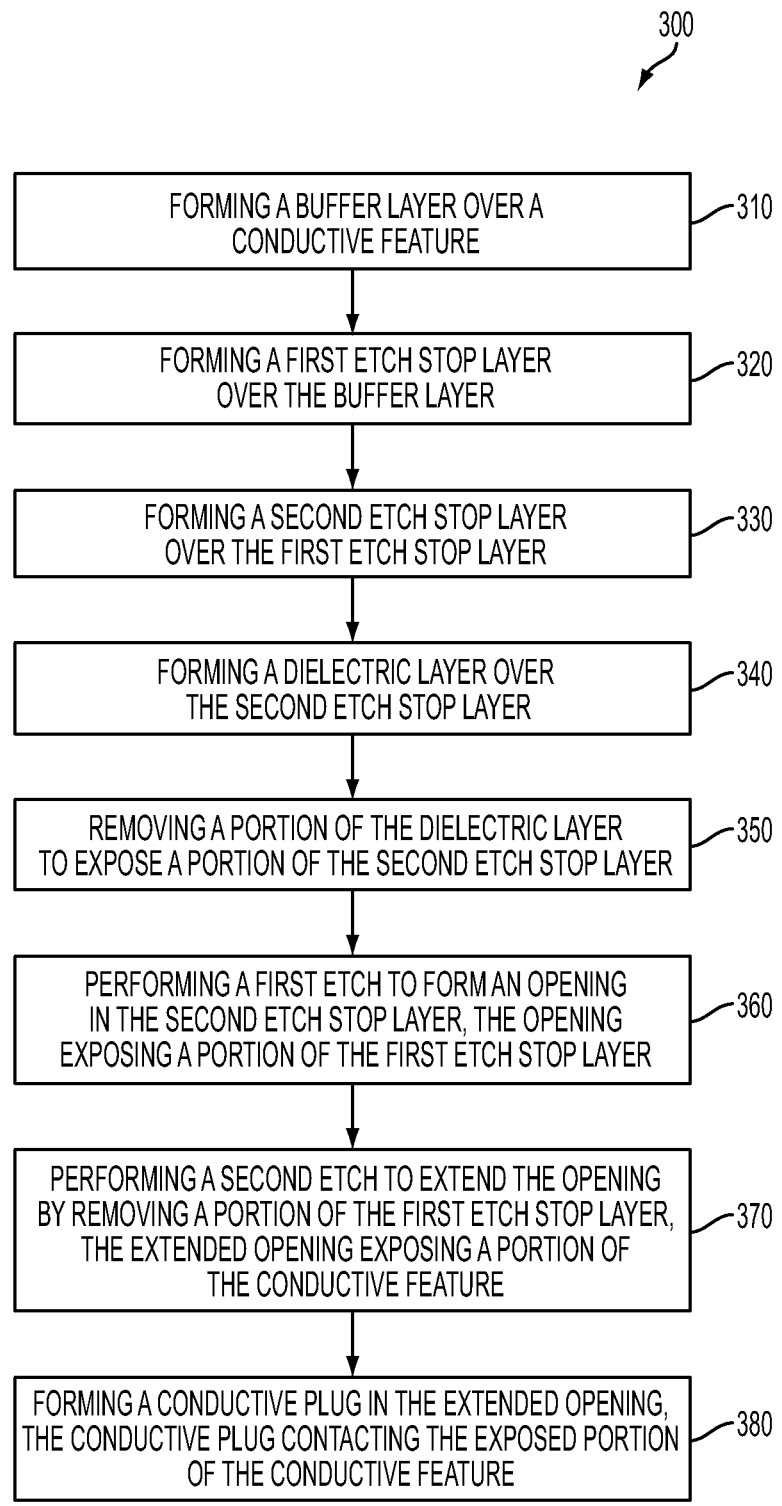
FIG. 3 is a flow chart of a method of forming a semiconductor structure in accordance with some embodiments.

FIG. 3 is a flow chart of a method 300 of forming a semiconductor structure in accordance with some embodiments. It is understood that additional processes may be provided before, during, and/or after the method 300 depicted in FIG. 3, and that some other processes may only be briefly described herein.

In operation 310, a buffer layer is formed over a conductive feature and a substrate, and the conductive feature is formed on or above the substrate. In operation 320, a first etch stop layer is formed over the buffer layer. In some embodiments, the first etch stop layer comprises silicon oxide doped with dopant such as carbon, nitride, hydrogen, indium, germanium, or a combination thereof. In at least one embodiment, the first etch stop layer comprises carbon-doped silicon oxide. In some embodiments, the first etch stop layer is formed by converting an upper portion of the buffer layer into the first etch stop layer. For example, carbon atoms are implanted onto the buffer layer by performing ion implantation or plasma assisted implantation. In some embodiments, the first etch stop layer is deposited or grown on the buffer layer by performing atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof. In yet some other embodiments, the first etch stop layer is deposited or grown over the buffer layer or, if operation 310 is omitted, over the conductive feature and the substrate.

In operation 330, a second etch stop layer is formed over the first etch stop layer. In some embodiments, the second etch stop layer comprises silicon nitride or silicon oxynitride. In some embodiments, the second etch stop layer is formed by performing ALD, CVD, wet oxidation, PVD, RPCVD, PECVD, MOCVD, sputtering, plating, other suitable processes, and/or combinations thereof. In some embodiments, the second etch stop layer comprises a tensile etch stop layer and/or a compressive etch stop layer.

Subsequently, in operation 340 a dielectric layer is formed over the second etch stop layer. In operation 350, a portion of the dielectric layer is removed to expose a portion of the second etch stop layer, using the second etch stop layer as the etch stop layer. In some embodiments, the removal of the dielectric layer is performed by performing ALD, CVD, wet oxidation, PVD, RPCVD, PECVD, MOCVD, sputtering, plating, other suitable processes, and/or combinations thereof.

In operation 360, an etch process (such as a dry etch process, a wet etch process, or a plasma etch process) is performed to form an opening in the second etch stop layer using the first etch stop layer as the etch stop layer. In some embodiments, the first etch stop layer comprises carbon-doped silicon oxide, the second etch stop layer comprises silicon nitride, and the first etch has a selectivity characteristic of silicon nitride over carbon-doped silicon oxide equal to or greater than 8 and a selectivity characteristic of silicon nitride over silicon oxide ranging from 2 to 3. In at least one embodiment, the etching process is performed by using source gases $CH_2F_2$ and/or $CHF_3$ together with Nitrogen, Argon, and/or Helium. In another embodiment, an etching chemical, such as $C_4F_6$ and/or $C_4F_8$, together with $CF_4$ plasma source gases are used for performing the etching process.

In operation 370, another etch process (such as a dry etch process, a wet etch process, or a plasma etch process) is performed to downwardly extend the opening by removing a portion of the exposed first etch stop layer, and the extended opening exposing a portion of the conductive feature. The buffer layer comprises silicon oxide, and the second etch has a selectivity characteristic of silicon nitride over silicon oxide equal to or less than 2. In at least one embodiment, the etching process is performed by using source gases $CH_2F_2$ and/or $CHF_3$ together with Nitrogen, Argon, and/or Helium. In another embodiment, an etching chemical, such as $C_4F_6$ and/or $C_4F_8$, together with $CF_4$ plasma source gases are used for performing the etching process.

In operation 380, a conductive plug is formed in the extended opening, and the conductive plug contacts the exposed portion of the conductive feature. In some embodiments, one or more operations are performed to form one or more conductive layers and interlayer dielectric layers over the dielectric layer in order to form a complete semiconductor circuit.

Figure 4A:
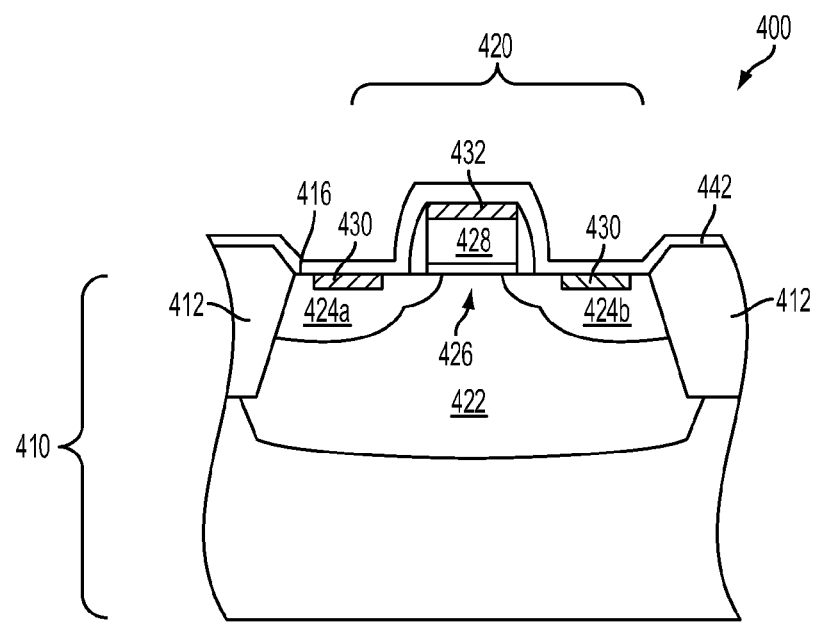
FIGS. 4A-4F are cross-sectional views of a semiconductor structure at various manufacturing stages in accordance with some embodiments.

FIG. 4A is a cross-sectional view of a semiconductor structure 400 after forming a buffer layer over a conductive structure (corresponding to operation 310 (FIG. 3)). Semiconductor structure 400 includes a substrate 410. In some embodiments, the substrate 410 includes: an elementary semiconductor such as silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, the substrate 410 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. Furthermore, in some embodiments, the semiconductor substrate is a semiconductor on insulator. In some examples, the semiconductor substrate includes a doped epi layer or a buried layer. In other examples, the compound semiconductor substrate has a multilayer structure, or the substrate includes a multilayer compound semiconductor structure.

In the semiconductor structure 400, one or more insulation structures 412 are at least partially formed within the substrate 410 to define and electrically isolate regions for forming electrical components such as a MOSFET 420. In some embodiments, the insulation structures 412 are local oxidation of silicon (LOCOS) structures or shallow trench isolation (STI) structures. In some embodiments, the insulation structures 412 comprise silicon oxide, silicon nitride, silicon oxynitride, fluoride-doped silicate glass (FSG), a low dielectric constant (low-K) dielectric material, other suitable materials, and/or combinations thereof.

In some embodiments, the MOSFET 420 is a PMOS transistor or an NMOS transistor. The MOSFET 420 has a well 422 formed in the substrate 410 and two doped source/drain regions 424a/424b formed in the well 422. The two doped source/drain regions 424a/424b are positioned to define a channel region 426 interposed between the doped source/drain regions 424a/424b. The MOSFET 420 also has a gate stack 428 formed over the channel region 426. One or more conductive features 430 are formed on or over an upper surface 416 of the substrate 410 to provide ohmic connection points for the drain and the source 424a/424b of the MOSFET 420. In some embodiments, a conductive feature 432 is formed at an upper portion of the gate stack 428. The MOSFET 420 is similar to the PMOS transistor or the NMOS transistor depicted in FIG. 1, and details that are the same or similar to the PMOS transistor or the NMOS transistor depicted in FIG. 1 are not repeated.

A buffer layer 442 is formed over the conductive features 430 and the substrate 410. In at least one embodiment, the buffer layer 442 comprises silicon oxide. In some embodiments, the buffer layer 442 comprises silicon oxide, silicon nitride, silicon oxy-nitride, silicon carbide, or combinations thereof. In some embodiments, the buffer layer 442 is formed by performing ALD, CVD, wet oxidation, PVD, RPCVD, PECVD, MOCVD, sputtering, plating, other suitable processes, and/or combinations thereof.

Figure 4B:
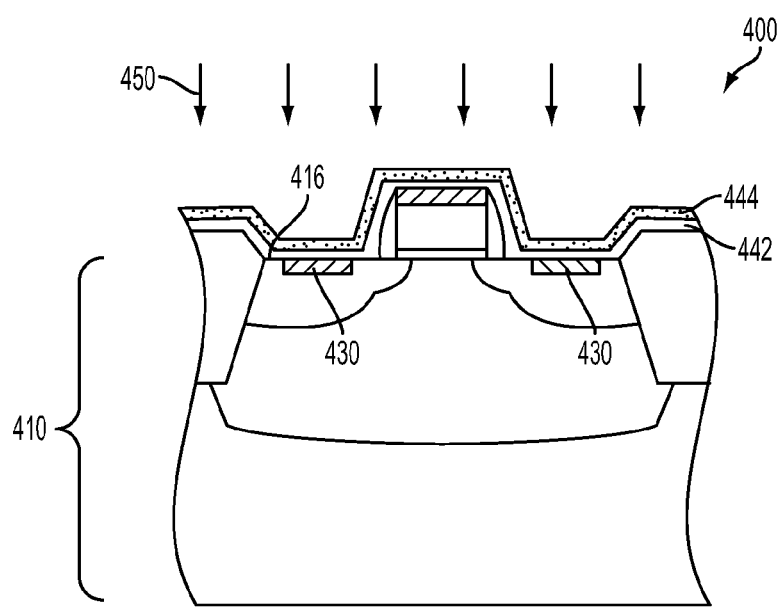

FIG. 4B is a cross-sectional view of the semiconductor structure 400 subject to a process 450 for forming a first etch stop layer 444 over a conductive feature 432 (corresponding to operation 320 (FIG. 3)). In some embodiments, the first etch stop layer 444 is a doped etch stop layer comprising silicon oxide doped with carbon, nitride, hydrogen, indium, germanium, or a combination thereof. In at least one embodiment, the first etch stop layer 444 comprises carbon-doped silicon oxide. In some embodiments, process 450 for forming the first etch stop layer 444 is an implantation process that implants carbon atoms to convert an upper portion of the buffer layer 442 into the first etch stop layer 444. In some embodiments, the implantation process comprises ion implantation or plasma assisted implantation. In yet some other embodiments, the first etch stop layer 444 is deposited or grown over the buffer layer 442 or, if operation 310 (FIG. 3) is omitted, over the conductive feature 432 and the substrate 410.

In some embodiments, the process 450 is a deposition process that deposits the first etch stop layer 444 on the buffer layer 442. In some embodiments, the deposition process comprises ALD, CVD, wet oxidation, PVD, RPCVD, PECVD, MOCVD, sputtering, plating, other suitable processes, and/or combinations thereof.

Figure 4C:
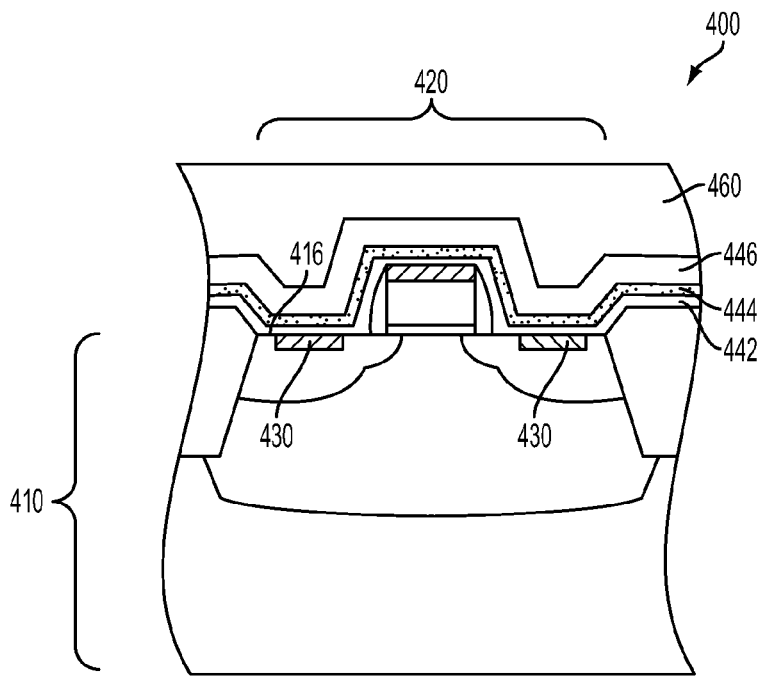

FIG. 4C is a cross-sectional view of the semiconductor structure 400 after forming a second etch stop layer 446 and a dielectric 460 layer over the first etch stop layer 444 (corresponding to operations 330 and 340 (FIG. 3)). The second etch stop layer 446 is formed over the first etch stop layer 444. In some embodiments, the second etch stop layer 446 comprises silicon nitride or silicon oxynitride. In some embodiments, the second etch stop layer 446 is formed by performing ALD, CVD, wet oxidation, PVD, RPCVD, PECVD, MOCVD, sputtering, plating, other suitable processes, and/or combinations thereof. In some embodiments, the second etch stop layer 446 comprises a tensile etch stop layer and/or a compressive etch stop layer. In at least one embodiment for forming a PMOS transistor, a portion of the second etch stop layer 446 over the MOSFET 420 comprises compressive silicon nitride. In yet another embodiment for forming an NMOS transistor, a portion of the second etch stop layer 446 over the MOSFET 420 comprises tensile silicon nitride.

Subsequently, a dielectric layer 460 is formed over the second etch stop layer 446. In some embodiments, the dielectric layer 460 comprises PSG, USG, PTEOS, BPTEOS, SOG, other suitable materials, or combinations thereof. In some embodiments, the dielectric layer 460 is formed by performing ALD, CVD, wet oxidation, PVD, RPCVD, PECVD, MOCVD, sputtering, plating, other suitable processes, and/or combinations thereof.

Figure 4D:
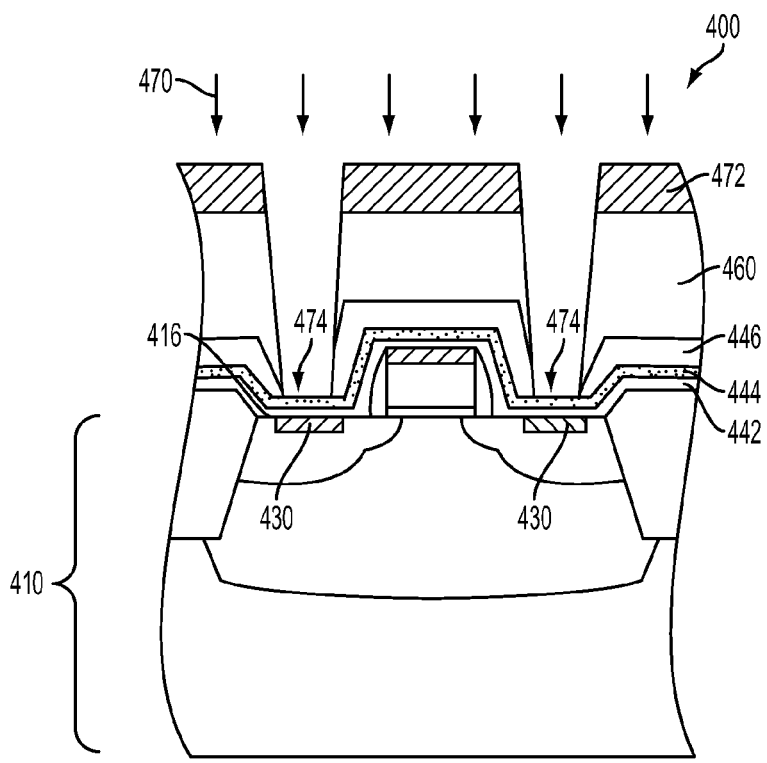

FIG. 4D is a cross-sectional view of the semiconductor structure 400 after removal of a portion of the dielectric layer 460 and subject to an etch process 470 for forming openings 474 in the second etch stop layer 446 (corresponding to operations 350 and 360 (FIG. 3)). First, a portion of the dielectric layer 460 is removed to expose a portion of the second etch stop layer 446, using the second etch stop layer 444 as the etch stop layer. In some embodiments, the removal of the dielectric layer 460 is performed by patterning a mask layer 472 by a photolithography process, and then etching trenches in the dielectric layer 460 (for example, by using a dry etching, wet etching, and/or plasma etching process).

Then, the etch process 470 (such as a dry etch process, a wet etch process, or a plasma etch process) is performed to form openings 474 in the second etch stop layer 444 using the first etch stop layer 442 as the etch stop layer. In some embodiments, the first etch stop layer 444 comprises carbon-doped silicon oxide, the second etch stop layer 446 comprises silicon nitride, and the first etch process 470 has a selectivity characteristic of silicon nitride over carbon-doped silicon oxide equal to or greater than 8 and a selectivity characteristic of silicon nitride over silicon oxide ranging from 2 to 3.

Figure 4E:
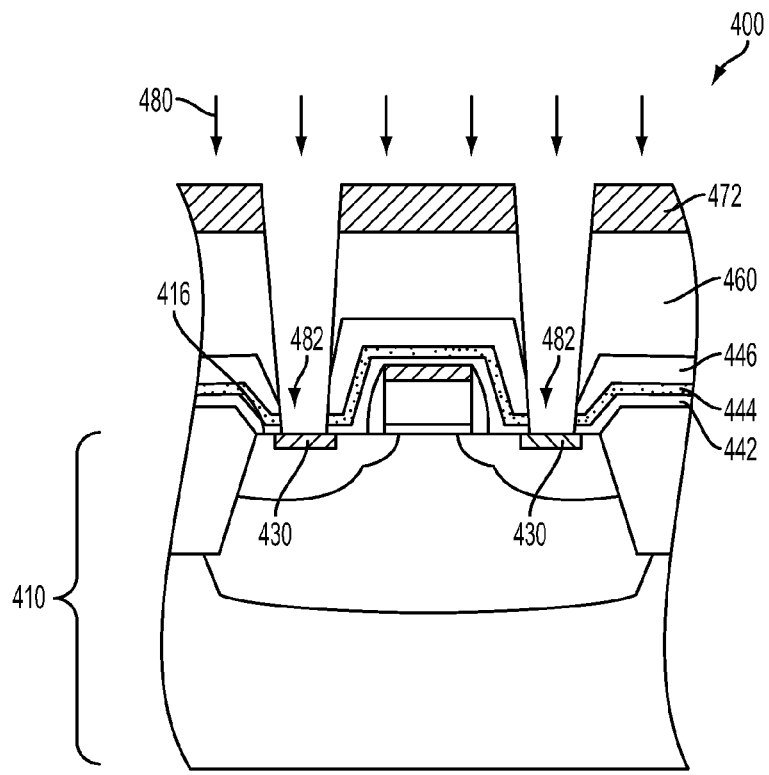

FIG. 4E is a cross-sectional view of the semiconductor structure 400 subject to an etch process 480 for downwardly extending the openings 474 by removing a portion of the exposed first etch stop layer 444 (corresponding to operation 370 (FIG. 3)). The extended opening 482 exposes a portion of the conductive features 430. In some embodiments, the buffer layer 442 comprises silicon oxide, and the second etch process 480 has a selectivity characteristic of silicon nitride over silicon oxide equal to or less than 2. Although the mask layer 472 is depicted in FIGS. 4D and 4E, in some embodiments, the mask layer 472 is not necessary for the etching of the first etch stop layer 444 or the second etch stop layer 446.

Figure 4F:
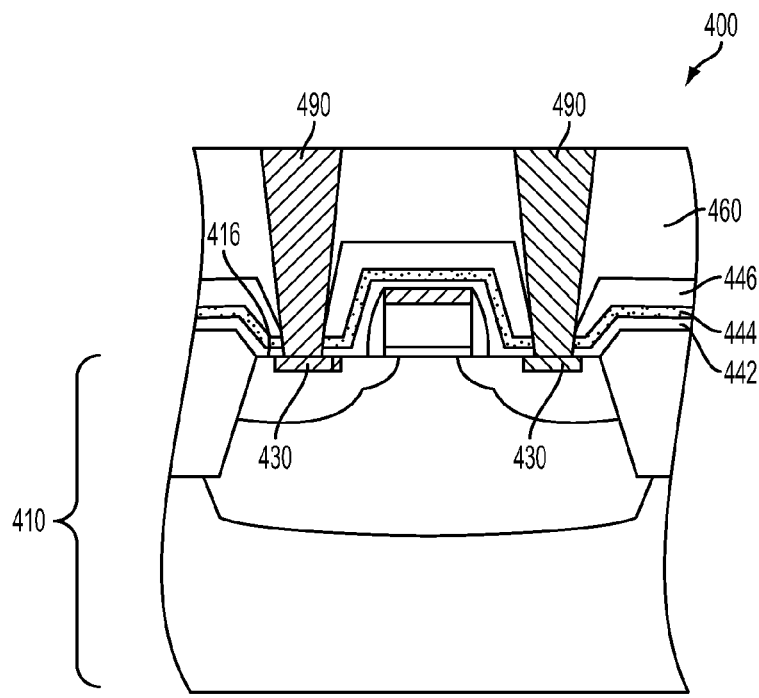

FIG. 4F is a cross-sectional view of the semiconductor structure 400 after forming contact plugs 490 in the extended opening 482 (corresponding to operation 380 (FIG. 3)). The conductive plug 490 contacts the exposed portion of the conductive feature 430. Subsequently, in some embodiments, one or more operations are performed to form one or more conductive layers and interlayer dielectric layers over the dielectric layer 460 in order to form a complete semiconductor circuit.

According to some embodiments, a semiconductor structure includes a substrate, a conductive feature over the substrate, a conductive plug structure contacting a portion of an upper surface of the conductive feature, a first etch stop layer over another portion of the upper surface of the conductive feature, and a second etch stop layer over the first etch stop layer. The first etch stop layer is a doped etch stop layer. The first etch stop layer is to function as an etch stop layer during a predetermined etching process for etching the second etch stop layer.

According to some embodiments, a manufacture includes a substrate, a conductive feature over the substrate, a conductive plug structure on a portion of an upper surface of the conductive feature, a first etch stop layer over another portion of the upper surface of the conductive feature, a second etch stop layer over the first etch stop layer, and a dielectric layer over the second etch stop layer and surrounding the conductive plug structure. The first etch stop layer has a first material and further doped with a second material. The first etch stop layer and the second stop layer are configured to have a selectivity characteristic during a predetermined etching process for etching the second etch stop layer.

According to some embodiments, a manufacture includes a substrate, a conductive feature over the substrate, a conductive plug structure on a portion of an upper surface of the conductive feature, a buffer layer on another portion of the upper surface of the conductive feature, a first etch stop layer on the buffer layer, and a second etch stop layer on the first etch stop layer. The buffer layer and the first stop layer are configured to have a first selectivity characteristic during a first etching process for etching the first etch stop layer. The first etch stop layer and the second stop layer are configured to have a second selectivity characteristic during a second etching process for etching the second etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a conductive feature over the substrate;
a conductive plug structure contacting a portion of an upper surface of the conductive feature;
a first etch stop layer over another portion of the upper surface of the conductive feature, the first etch stop layer being a doped etch stop layer;
a buffer layer between the another portion of the upper surface of the conductive feature and the first etch stop layer, the buffer layer and the first etch stop layer comprising a same material; and
a second etch stop layer over the first etch stop layer, the first etch stop layer being configured to function as an etch stop layer during a predetermined etching process for etching the second etch stop layer.

2. The semiconductor structure of claim 1, wherein the first etch stop layer comprises carbon-doped silicon oxide.

3. The semiconductor structure of claim 1, wherein the conductive feature comprises metal silicide.

4. The semiconductor structure of claim 1, wherein the first etch stop layer has a thickness ranging from 5 to 40 angstroms.

5. The semiconductor structure of claim 1, wherein the first etch stop layer comprises silicon oxide doped with carbon, nitride, hydrogen, indium, germanium, or a combination thereof.

6. The semiconductor structure of claim 1, wherein the second etch stop layer comprises silicon nitride or silicon oxynitride.

7. The semiconductor structure of claim 1, wherein the second etch stop layer has a thickness ranging from 200 to 800 angstroms.

8. The semiconductor structure of claim 1, further comprising a dielectric layer formed over the second etch stop layer and surrounding the conductive plug structure.

9. The semiconductor structure of claim 1, wherein the buffer layer has a thickness ranging from 10 to 90 angstroms.

10. The semiconductor structure of claim 1, wherein the buffer layer comprises silicon oxide.

11. A manufacture, comprising:
a substrate;
a conductive feature over the substrate;
a conductive plug structure on a portion of an upper surface of the conductive feature;
a first etch stop layer over another portion of the upper surface of the conductive feature, the first etch stop layer comprising a first material and further doped with a second material;
a buffer layer between the another portion of the upper surface of the conductive feature and the first etch stop layer, the buffer layer comprising the first material;
a second etch stop layer over the first etch stop layer, the first etch stop layer and the second stop layer being configured to have a selectivity characteristic during a predetermined etching process for etching the second etch stop layer; and
a dielectric layer over the second etch stop layer and surrounding the conductive plug structure.

12. The manufacture of claim 11, wherein the buffer layer has a thickness ranging from 10 to 90 angstroms.

13. The manufacture of claim 11, wherein the first material comprises silicon oxide, and the second material comprises carbon, nitride, hydrogen, indium, germanium, or a combination thereof.

14. The manufacture of claim 11, wherein the first etch stop layer has a thickness ranging from 5 to 40 angstroms.

15. The manufacture of claim 11, wherein the second etch stop layer comprises silicon nitride or silicon oxynitride.

16. The manufacture of claim 11, wherein the second etch stop layer has a thickness ranging from 200 to 800 angstroms.

17. A manufacture, comprising:
a substrate;
a conductive feature over the substrate;
a conductive plug structure on a portion of an upper surface of the conductive feature;
a buffer layer on another portion of the upper surface of the conductive feature;
a first etch stop layer on the buffer layer, the buffer layer and the first etch stop layer being configured to have a first selectivity characteristic during a first etching process for etching the first etch stop layer; and
a second etch stop layer directly on the first etch stop layer, the first etch stop layer and the second etch stop layer being configured to have a second selectivity characteristic during a second etching process for etching the second etch stop layer,
wherein:
the buffer layer comprises a dielectric material, and the first etch stop layer comprises the dielectric material doped with carbon, nitride, hydrogen, indium, germanium, or a combination thereof.

18. The manufacture of claim 17, wherein the first etch stop layer has a thickness ranging from 5 to 40 angstroms.

19. The manufacture of claim 17, wherein the buffer layer comprises silicon oxide.

20. The manufacture of claim 17, wherein the buffer layer has a thickness ranging from 10 to 90 angstroms.

* * * * *